(12) United States Patent
Sasaki et al.

(10) Patent No.: US 8,981,263 B2
(45) Date of Patent: Mar. 17, 2015

(54) ELECTROSTATIC CHUCK APPARATUS

(75) Inventors: Yasuharu Sasaki, Yamanashi (JP);
Kenji Masuzawa, Yamanashi (JP);
Toshiyuki Makabe, Yamanashi (JP);
Mamoru Kosakai, Tokyo (JP); Takashi Satou, Tokyo (JP); Kazunori Ishimura, Tokyo (JP); Ryuuji Hayahara, Tokyo (JP); Hitoshi Kouno, Tokyo (JP)

(73) Assignees: Tokyo Electron Limited, Tokyo (JP);
Sumitomo Osaka Cement Co., Ltd., Tokyo (JP)

( * ) Notice: Subject to any disclaimer, the term of this patent is extended or adjusted under 35 U.S.C. 154(b) by 316 days.

(21) Appl. No.: 13/513,380

(22) PCT Filed: Dec. 8, 2010

(86) PCT No.: PCT/JP2010/072008
§ 371 (c)(1),
(2), (4) Date: Jul. 25, 2012

(87) PCT Pub. No.: WO2011/071073
PCT Pub. Date: Jun. 16, 2011

(65) Prior Publication Data
US 2012/0281334 A1    Nov. 8, 2012

(30) Foreign Application Priority Data

Dec. 10, 2009 (JP) .................. 2009-280672

(51) Int. Cl.
*H05B 3/68* (2006.01)
*C23C 16/00* (2006.01)
(Continued)

(52) U.S. Cl.
CPC ...... *H01L 21/6831* (2013.01); *H01L 21/67069* (2013.01); *H01L 21/67103* (2013.01); *H01L 21/67109* (2013.01); *H01L 21/67248* (2013.01)
USPC ...................... 219/444.1; 118/725

(58) Field of Classification Search
CPC .................. H01L 21/67103; H01L 21/67248; H01L 21/6831; H05B 3/12–3/283
USPC ............ 219/443.1–468.2, 528; 118/724, 725; 392/418
See application file for complete search history.

(56) References Cited

U.S. PATENT DOCUMENTS 6,475,336 B1 * 11/2002 Hubacek ................. 156/345.51
6,676,804 B1 *  1/2004 Koshimizu et al. ...... 156/345.53
(Continued)

FOREIGN PATENT DOCUMENTS

JP    07-310187    11/1995
JP    07310187 A   11/1995
(Continued)

OTHER PUBLICATIONS

International Search Report issued in International Patent Application No. PCT/JP2010/072008, mailed Jan. 11, 2011, 4 pages.
(Continued)

*Primary Examiner* — Sang Y Paik
(74) *Attorney, Agent, or Firm* — Wood, Herron & Evans, LLP

(57) ABSTRACT

Disclosed is an electrostatic chuck apparatus which is configured of: an electrostatic chuck section; an annular focus ring section provided to surround the electrostatic chuck section; and a cooling base section which cools the electrostatic chuck section and the focus ring section. The focus ring section is provided with an annular focus ring, an annular heat conducting sheet, an annular ceramic ring, a nonmagnetic heater, and an electrode section that supplies power to the heater.

11 Claims, 3 Drawing Sheets

(51) Int. Cl.
*H01L 21/683* (2006.01)
*H01L 21/67* (2006.01)

(56) References Cited

U.S. PATENT DOCUMENTS

| | | | |
|---|---|---|---|
| 7,713,431 B2* | 5/2010 | Ukei et al. | 216/67 |
| 2004/0005726 A1 | 1/2004 | Huang | |
| 2004/0261946 A1 | 12/2004 | Endoh et al. | |
| 2008/0236749 A1* | 10/2008 | Koshimizu et al. | 156/345.33 |
| 2008/0257495 A1* | 10/2008 | Tadokoro et al. | 156/345.27 |
| 2011/0000883 A1* | 1/2011 | Endoh et al. | 216/67 |

FOREIGN PATENT DOCUMENTS

| | | |
|---|---|---|
| JP | 10-144663 | 5/1998 |
| JP | 10144663 A | 5/1998 |
| JP | 10-150021 | 6/1998 |
| JP | 10150021 A | 6/1998 |
| JP | 11-026563 | 1/1999 |
| JP | 11026563 A | 1/1999 |
| JP | 2001-274142 | 10/2001 |
| JP | 2001274142 A | 10/2001 |
| JP | 2002-016126 A | 1/2002 |
| JP | 2002-164323 | 6/2002 |
| JP | 2002164323 A | 6/2002 |
| JP | 2005520337 A | 7/2005 |
| JP | 2005-353812 | 12/2005 |
| JP | 2005353812 A | 12/2005 |
| JP | 2006-127900 | 5/2006 |
| JP | 2006-128529 | 5/2006 |
| JP | 2006127900 A | 5/2006 |
| JP | 2006128529 A | 5/2006 |
| JP | 3155802 U | 11/2009 |

OTHER PUBLICATIONS

Japanese Patent Office, Office Action issued in Application No. 2009-280672, mailed Aug. 20, 2013, 6 pp.
European Patent Office, European Search Report issued in corresponding European Patent Application No. 10835993.6 dated Jun. 4, 2014 (7 pages).

* cited by examiner

ELECTROSTATIC CHUCK APPARATUS

TECHNICAL FIELD

The present invention relates to an electrostatic chuck apparatus, more specifically, to an electrostatic chuck apparatus which is suitable for being used in a plasma processing apparatus of a high frequency discharge type which applies a high frequency to an electrode to generate a plasma, and performs a plasma processing such as a plasma etching on a plate-like specimen such as a semiconductor wafer by the plasma.

Priority is claimed on Japanese Patent Application No. 2009-280672 filed in the Japanese Patent Office on Dec. 10, 2009, the contents of which are incorporated herein by reference.

BACKGROUND ART

In the related art, in the processing such as an etching, a deposition, an oxidation, and a sputtering in a manufacturing process of a semiconductor device such as an IC, an LSI, and a VLSI, a flat panel display (FPD) such as a liquid crystal display or the like, plasma has been widely used in order to perform a satisfactory reaction on a processing gas at a relatively low temperature.

For example, in the etching process of a semiconductor device using a silicon wafer, a plasma etching apparatus of a high frequency discharge type is used.

However, in the plasma etching apparatus, a phenomenon occurs in which etching characteristics in a center section of the silicon wafer are different from etching characteristics in an outer periphery portion of the silicon wafer.

Thus, in order to equalize the etching characteristics of the silicon wafer in a plane, placing a focus ring having an annular shape on the outside of the silicon wafer has been carried out so as to surround the silicon wafer.

However, even in a case of using the focus ring, when the plasma etching is performed on the silicon wafer, a temperature difference is generated between the center section of the silicon wafer and the outer periphery portion thereof, and a difference between an etching rate in the center section of the silicon wafer and an etching rate in the outer periphery portion thereof is generated due to the temperature difference.

In such a case, there has been a problem in that a state is generated where an etching result in the surface of the silicon wafer is non-uniform, and thus yield characteristics of the obtained semiconductor device decline by the non-uniformity of the in-plane processing shape due to the etching.

In order to solve the problem, a plasma etching processing apparatus of a magnetron type is suggested in which a temperature detector is placed near a surface of an inner portion of a focus ring without being exposed to the surface (Patent Document 1).

In the plasma etching processing apparatus, the temperature of the focus ring is detected at all times by the temperature detector, the temperature of the focus ring is controlled so as to be maintained at the same temperature as that of the silicon wafer by performing the temperature controlling of the focus ring. Thus, a difference in surface reaction of a radical between on the silicon wafer and on the focus ring is suppressed, a fluctuation in the etching rate in the plane of the silicon wafer is suppressed, and the uniformity of the etching is improved.

CITATION LIST

Patent Document

[Patent Document 1] Japanese Unexamined Patent Application, First Publication No. 2002-164323

SUMMARY OF INVENTION

Technical Problem

However, in the plasma etching processing apparatus in which the temperature detector is provided in the focus ring of the related art mentioned above, in a case where the silicon wafer is emitted with the plasma, a temperature rising rate on the surface of the focus ring due to the plasma irradiation is slower than the temperature rising rate in the plane of the silicon wafer. Thus, in an initial stage of the plasma irradiation, the surface temperature of the focus ring is suppressed to be lower than the surface temperature of the silicon wafer, and in a final stage of the plasma irradiation, on the contrary, the surface temperature of the focus ring becomes higher than the surface temperature of the silicon wafer. Accordingly, there has been a problem in that, since the temperature difference is generated between the focus ring and the silicon wafer, as a consequence, the in-plane temperature of the silicon wafer is not also stable.

Furthermore, in the plasma etching processing apparatus, it is also possible to cool the focus ring by the use of the cooler when irradiating the plasma, but, in this case, it is difficult to adjust the temperature rising due to the plasma irradiation of the focus ring by the cooler, and it is difficult to accurately adjust the surface temperature of the focus ring.

In this manner, there has been a problem in that, even in the case of providing the temperature detector in the focus ring, a state is generated where the etching result in the plane of the silicon wafer is non-uniform, and thus the yield characteristics of the obtained semiconductor wafer decline by the non-uniformity of the in-plane processing shape due to the etching.

In addition, since the adjustment of the surface temperature of the focus ring is difficult, in a case where the surface temperature of the focus ring is lower than the surface temperature of the silicon wafer, there has been a problem in that the deposits are easily deposited on the focus ring.

The present invention has been made in view of the above circumstances, and an object thereof is to provide an electrostatic chuck apparatus which is able to maintain the constant temperature of the focus ring being processed, by adjusting the temperature of the focus ring provided so as to surround the plate-like specimen such as the silicon wafer when being applied to the processing apparatus such as the plasma etching apparatus, is able to stabilize the temperature of the outer periphery portion of the plate-like specimen, is able to equalize the etching characteristics in the plane of the plate-like specimen, and is able to prevent the deposits from being deposited on the focus ring.

Solution to Problem

As a result of intensive studies in order to solve the problems mentioned above, the present inventors discovered that, if the annular focus ring section provided so as to surround the electrostatic chuck section has a configuration that includes a focus ring, a ceramic plate, a heater section formed from a non-magnetic body and an electrode section supplying electricity to the heater section, the temperature of the focus ring section being processed can be maintained constantly by adjusting the temperature of the focus ring section, the temperature of the outer periphery portion of the plate-like specimen such as the silicon wafer can be stabilized, the etching characteristics in the plane of the plate-like specimen can be uniform, and it is possible to prevent the deposits from being deposited on the focus ring section. Thus, the present invention was completed.

That is, an electrostatic chuck apparatus according to the present invention includes the aspects as below.

<1> An electrostatic chuck apparatus which includes an electrostatic chuck section, one main surface of which is a placing surface for placing a plate-like specimen, and which is equipped with an internal electrode for electrostatic adsorption; an annular focus ring section provided so as to surround the electrostatic chuck section; and a cooling base section which is provided on the other main surface side of the electrode chuck section to cool the electrostatic chuck section and the focus ring section, wherein the focus ring section includes a focus ring, a ceramic plate which is provided between the focus ring and the cooling base section, a heater section which is provided between the ceramic plate and the cooling base section and is formed from a non-magnetic body, and an electrode section which supplies electricity to the heater section.

<2> The electrostatic chuck apparatus according to <1>, wherein the ceramic plate is constituted by any one kind of an annular ceramic plate, a plurality of ceramic pieces formed by dividing the annular ceramic plate in a circumferential direction, and a plurality of annular ceramic pieces formed by dividing the annular ceramic plate in a radial direction.

<3> The electrostatic chuck apparatus according to <1> or <2>, wherein the heater section is a sheet-like heater portion.

<4> The electrostatic chuck apparatus according to any one of <1> to <3>, wherein the heater section is fixed to the ceramic plate by a first insulating adhesive layer, is fixed to the cooling base section by a second insulating adhesive layer, and is insulated by the first insulating adhesive layer and the second insulating adhesive layer.

<5> The electrostatic chuck apparatus according to any one of <1> to <4>, wherein an insulating ceramic membrane or an insulating organic film is provided between the cooling base section and the heater section.

<6> The electrostatic chuck apparatus according to any one of <1> to <5>, wherein temperature measuring means is provided in the focus ring section.

<7> The electrostatic chuck apparatus according to any one of <1> to <6>, wherein the heater section has an electrical conductivity of $0.5 \times 10^6$ S/m or more and $20 \times 10^6$ S/m or less, and a coefficient of thermal expansion of $0.1 \times 10^{-6}$/K or more and $100 \times 10^{-6}$/K or less.

<8> The electrostatic chuck apparatus according to any one of <1> to <7>, wherein the heater section is formed from titanium or titanium alloy.

<9> The electrostatic chuck apparatus according to any one of <1> to <8>, wherein the ceramic plate has insulating properties and has a thermal conductivity of 1 W/mK or more.

<10> The electrostatic chuck apparatus according to any one of <1> to <9>, wherein the coefficient of heat transfer between the heater section and the cooling base section is 400 $W/m^2K$ or more and 10,000 $W/m^2K$ or less.

Advantageous Effects of Invention

According to the electrostatic chuck apparatus of the present invention, the annular focus ring section is provided so as to surround the electrostatic chuck section, and the focus ring section is constituted by the focus ring section, the ceramic plate provided between the focus ring and the cooling base section, the heater formed from the non-magnetic body provided between the ceramic plate and the cooling base section, and the electrode supplying electricity to the heater section. Thus, by adjusting the temperature of the focus ring section by the heater, the temperature of the focus ring section being processed can be maintained constantly. Accordingly, the temperature of the outer periphery portion of the plate-like specimen such as the silicon wafer can be stabilized, and thus, the etching characteristics in the plane of the plate-like specimen can be equalized.

Furthermore, since the surface temperature of the focus ring can be accurately adjusted, the temperature difference between the surface temperature of the focus ring and the surface temperature of the plate-like specimen can be eliminated, whereby it is possible to prevent the deposits from being deposited on the focus ring.

DESCRIPTION OF EMBODIMENTS

An embodiment of an electrostatic chuck apparatus of the present invention will be described.

In addition, in the respective embodiments mentioned below will be specifically described in order to better understand the spirit of the present invention, but the present invention is not limited, unless otherwise particularly specified.

Figure 1:
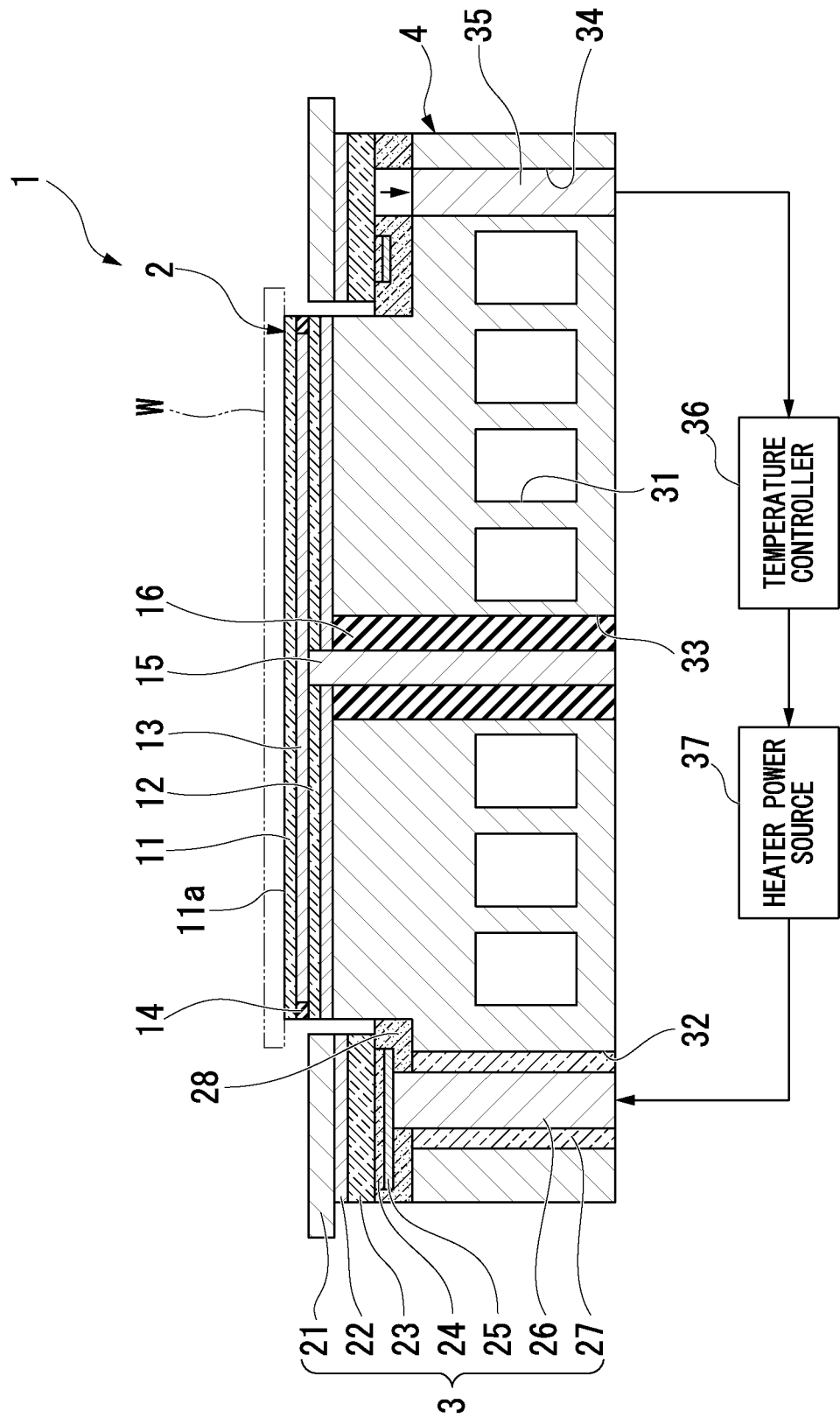
FIG. 1 is a cross-sectional view that shows an electronic chuck apparatus of an embodiment of the present invention.

FIG. 1 is a cross-sectional view that shows an electrostatic chuck apparatus of an embodiment of the present invention, and the electrostatic chuck apparatus 1 is constituted by an electrostatic chuck section 2, an annular focus ring section 3 provided so as to surround the electrostatic chuck section 2, and a cooling base section 4 which cools the electrostatic chuck section 2 and the focus ring section 3.

The electrostatic chuck section 2 includes a circular dielectric layer 11 in which an upper surface (one major surface) thereof is a placing surface for placing a plate-like specimen W such as a semiconductor wafer, a circular insulating layer 12 which is oppositely arranged on a lower surface (the other major surface) side of the dielectric layer 11 and has the same diameter as that of the dielectric layer 11, an electrostatic adsorption internal electrode 13 of an annular shape which is interposed between the dielectric layer 11 and the insulating layer 12 and has a diameter smaller than those of the dielectric layer 11 and the insulating layer 12, an annular insulating material layer 14 provided on the outer periphery side of the electrostatic adsorption internal electrode 13 so as to surround the same, a power supplying terminal 15 which is connected to a lower surface center portion of the electrostatic adsorption internal electrode 13 to apply the direct current voltage, and a cylindrical insulator 16 which is isolated from the outside by covering the periphery of the power supplying terminal 15.

Preferably, both of the dielectric layer 11 and the insulating layer 12 are ceramics having the heat resistance. As the ceramics, ceramics formed of one kind selected from aluminum nitride (AlN), aluminum oxide ($Al_2O_3$), silicon nitride ($Si_3N_4$), zirconium oxide ($ZrO_2$), sialon, boron nitride (BN), silicon carbide (SiC), or composite ceramics including two kinds or more are preferably used.

Particularly, in view of the fact that upper surface 11a becomes an electrostatic adsorption surface, the dielectric layer 11 is made from a material which has a particularly high dielectric constant, and does not become impurities with respect to the electrostatically adsorbed plate-like specimen W. For example, silicon carbide-aluminum oxide compound sintered compact is preferably used which contains silicon carbide of 4 weight % or more and 20 weight % or less and the remainders of aluminum oxide.

As the electrostatic adsorption internal electrode 13, a flat plate ceramic having a thickness of about 10 μm to 50 μm and conductivity is used. A volume resistivity value of the electrostatic adsorption internal electrode 13 under the working temperature of the electrostatic chuck apparatus 1 is preferably equal to or less than $1.0 \times 10^6$ Ω·cm, and more preferably, is equal to or less than $1.0 \times 10^4$ Ω·cm.

As the conductive ceramics constituting the electrostatic adsorption internal electrode 13, silicon carbide (SiC)-aluminum oxide ($Al_2O_3$) compound sintered compact, tantalum nitride (TaN)-tantalum oxide ($Al_2O_3$) compound sintered compact, tantalum carbide (TaC)-aluminum oxide ($Al_2O_3$) compound sintered compact, molybdenum carbide ($Mo_2C$)-aluminum oxide ($Al_2O_3$) compound sintered compound or the like are adopted.

The insulating material layer 14 joins the dielectric layer 11 and the insulating layer 12 to integrate them, and protects the electrostatic adsorption internal electrode 13 from the plasma. As a material constituting the insulating material layer 14, an insulating material having the same main component as those of the dielectric layer 11 and the insulating layer 12 is preferably used. For example, when the dielectric layer 11 and the insulating layer 12 are formed by silicon carbide-aluminum oxide compound sintered compact, aluminum oxide ($Al_2O_3$) is preferably used.

The focus ring section 3 includes a focus ring 21 formed from an annular plate material which has an inner diameter slightly larger than a diameter of the electrostatic chuck section 2 and an outer diameter slightly larger than an outer diameter of the cooling base section 4; an annular thermal conducting sheet 22 which is adhered to a lower surface of the focus ring 21 and has an inner diameter identical to the inner diameter of the focus ring 21 and an outer diameter smaller than the outer diameter of the focus ring 21; an annular ceramic ring (a ceramic plate) 23 which is adhered to a lower surface of the thermal conducting sheet 22 and has an inner diameter and an outer diameter substantially identical to those of the thermal conducting sheet 22; a heater 25 which is adhered to the lower surface of the ceramic ring 23 via a sheet-like (first) insulating adhesive layer 24 and is formed from a non-magnetic body; a heater electrode 26 which is bonded to the lower surface of the heater 25 to supply electricity to the heater 25; and a cylindrical heater insulator 27 which is isolated from the outside by covering the periphery of the heater electrode 26.

The focus ring section 3 is bonded and fixed to the cooling base section 4 via a (second) insulating adhesive layer 28.

The focus ring 21 is controlled so as to be the same temperature as that of the plate-like specimen W by a processing step such as a plasma etching. As the material thereof, for example, in a case of being used in oxide film etching, polycrystalline silicon, silicon carbide or the like are suitably used.

The thermal conducting sheet 22 transmits heat from the ceramic ring 23 subjected to the temperature control to the focus ring 21, and a sheet-like material having high thermal conductivity or the like is suitably used.

In order that the thermal conducting sheet 22 continues to favorably hold the thermal conduction between the focus ring 21 and the ceramic ring 23, it is necessary that the coefficient of heat transfer in the case of interposing the thermal conducting sheet 22 between the focus ring 21 and the ceramic ring 23 be equal to or greater than 500 W/m$^2$K.

Herein, in a case where the coefficient of heat transfer is less than 500 W/m$^2$K, an influence of the temperature rising of the focus ring 21 is increased when high frequency is applied, it is impossible to control the temperature of the focus ring 21 due to the heater 25 and the cooling base section 4, and the case is not preferable.

The ceramic ring 23 is, for example, an annular ceramic plate having insulating properties formed from aluminum oxide ($Al_2O_3$), quartz or the like, and the thermal conductivity thereof is equal to or greater than 1 W/mK.

When the thermal conductivity is less than 1 W/mK, heat from the heater 25 cannot be rapidly transmitted to the focus ring 21 via the thermal conducting sheet 22, a temperature difference is generated between the surface temperature of the focus ring 21 and the surface temperature of the electrostatic chuck section 2, and thus, the surface temperature of the plate-like specimen W placed on the electrostatic chuck section 2 is not stable. As a consequence, it is impossible to equalize the in-plane characteristics of the plate-like specimen W subjected to various processes, and the case is not preferable.

Figure 2:
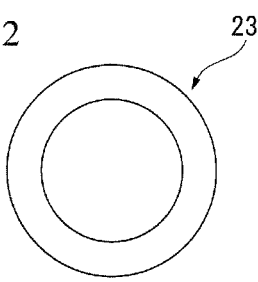
FIG. 2 is a plan view that shows an example of a shape of a ceramic ring of the electronic chuck apparatus of an embodiment of the present invention.
Figure 3:
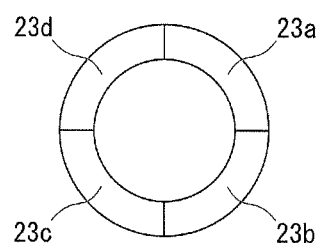
FIG. 3 is a plan view that shows another example of the shape of the ceramic ring of the electrostatic chuck apparatus of an embodiment of the present invention.
Figure 4:
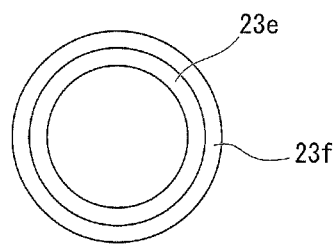
FIG. 4 is a plan view that shows still another embodiment of the shape of the ceramic ring of the electrostatic chuck apparatus of an embodiment of the present invention.

In addition to the annular shape shown in FIG. 2, the ceramic ring 23 may be an arc-shaped ceramic piece in which the annular ceramic plate is divided into a plurality of parts in a circumferential direction, for example, the arc-shaped ceramic pieces 23a to 23d shown in FIG. 3 may be combined with each other in an annular shape, an annular ceramic pieces may be used in which the annular ceramic piece is divided into a plurality of parts in a radial direction, for example, annular ceramic pieces 23e to 23f shown in FIG. 4 may be concentrically combined with each other.

As the insulating adhesive layers 24 and 28, the adhesive having the heat resistance in the temperature range of −20° C. to 150° C. is suitably used. For example, silicon resin, silicon resin containing a filler such as alumina and aluminum nitride, acryl resin, epoxy resin or the like are preferable. Particularly, in the case of using the oxygen-based plasma, silicon resin having an excellent plasma resistance with respect to the oxygen-based plasma is preferable.

The insulating adhesive layers 24 and 28 may be the same material and may be materials different from each other. Furthermore, the shapes thereof may be the sheet-like adhesive, and a liquid adhesive or the like may be adopted which is cured by heat and an ultraviolet irradiation. In brief, the insulating adhesive layers may be suitably selected and used according to the material composition and the shape of a member to be bonded.

Specifically, for example, the insulating adhesive layer 24 is preferably the sheet-like epoxy resin, and the insulating adhesive layer 28 is preferably the silicon resin.

The heater 25 controls the temperature of the focus ring 21 to the same temperature as that of the plate-like specimen W, by heating the temperature of the focus ring 21 to a predetermined temperature at a certain temperature rising rate via the ceramic ring 23. In order to sufficiently demonstrate the function as the heater 25, electrical conductivity thereof is preferably $0.5 \times 10^6$ S/m or more and $20 \times 10^6$ S/m or less, and, more preferably, $0.9 \times 10^6$ S/m or more and $5 \times 10^6$ S/m or less.

Furthermore, even in a case where the heating and the cooling are repeated, it is necessary that the heater 25 does not peel off from the ceramic ring 23 and the cooling base section 4. Thus, coefficient of thermal expansion thereof is preferably $0.1 \times 10^{-6}$/K or more and $100 \times 10^{-6}$/K or less, more preferably, $0.1 \times 10^{-6}$/K or more and $20 \times 10^{-6}$/K or less, and, still more preferably, $4 \times 10^{-6}$/K or more and $10 \times 10^{-6}$/K or less.

Since the heater itself avoids the self-heating by the high frequency (RF) when the high frequency (RF) is applied in a case of being applied to a plasma processing apparatus using the high frequency (RF), the heater 25 needs to be a non-magnetic material, and a conductor formed from the sheet-like non-magnetic material is suitably used. As such a conductor, for example, a titanium foil, titanium alloy foil or the like are adopted.

The thickness of the heater 25 is, preferably, equal to or less than 200 μm, and, more preferably, equal to or less than 120 μm.

By making the thickness of the heater 25 equal to or less than 200 μm, when bonding and fixing the heater 25 to the cooling base section 4 via the insulating adhesive layer 28, the thickness of the insulating adhesive layer 28 from the ceramic ring 23 to the cooling base section 4 can be reduced, and thus, it is possible to reduce an area to be exposed to the plasma in an exposed cross-section of the insulating adhesive layer 28. As a consequence, it is possible to reduce the damage to the insulating adhesive layer 28 due to the plasma when irradiating the plasma.

The heater 25 is bonded to the lower surface of the ceramic ring 23 via the insulating adhesive layer 24, and is bonded and fixed to the cooling base section 4 via the insulating adhesive layer 28. In addition, the heater 25 is held while favorably keeping an interval between them, without coming into contact with the cooling base section 4, and the insulating adhesive is filled in the gap, and thus, the insulating properties between the ceramic ring 23 and the cooling base section 4 can be favorably maintained, whereby it is possible to reduce the thermal stress of the heater 25 by the insulating adhesive layers 24 and 28.

The cooling base section 4 is provided on the lower sides of the electrostatic chuck section 2 and the focus ring section 3 to control the temperatures of the electrostatic chuck section 2 and the focus ring section 3 to desired temperatures, combines a high frequency generating electrode, and is formed by a metal having good thermal conductivity such as aluminum. An inner portion thereof is formed with a flow path 31 through which a cooling medium such as water and organic solvent is circulated. The cooling base section 4 is able to maintain the temperature of the plate-like specimen W placed on the upper surface 11a of the dielectric layer 11 to a desired temperature.

The heater electrode 26 and the heater insulator 27 are fixed to a through hole 32 formed on the underside of the heater 25 of the cooling base section 4, the power supplying terminal 15 and the insulator 16 are fixed to a through hole 33 formed in the center portion of the cooling base section 4, and an optical thermometer (temperature measuring means) 35 for directly measuring the temperature of the ceramic ring 23 by receiving light emitted from the ceramic ring 23 is fixed to a through hole 34 of an opposite side of the though hole 32 to the center axis of the cooling base section 4.

The optical thermometer 35 may have a configuration that directly measures the temperature of the heater 25, and may have a configuration that directly measures the temperature of the focus ring 21.

A temperature controller 36 and a heater power source 37 are connected to the optical thermometer 35 in series, and the heater power source 37 is connected to the heater electrode 26.

Herein, if one wants to know the temperature of the ceramic ring 23, when the optical thermometer 35 detects light emitted from the ceramic ring 23, it is possible to directly know the temperature of the ceramic ring 23 from a wavelength band of the light.

Herein, the optical thermometer 35 converts the value of the temperature corresponding to the light into an electrical signal and outputs the signal to the temperature controller 36. In the temperature controller 36, the control signal, which controls the electrical power applied to the heater 25 based on the electrical signal from the optical thermometer 35, is output to the heater power source 37. In the heater power source 37, the controlled electrical power is output to the heater 25 based on the control signal which is output from the temperature controller 36, and an amount of heat emitted from the heater 25 is controlled.

Thus, the focus ring 21 can be heated up to a predetermined temperature at a certain temperature rising rate via the ceramic ring 23 by using the heater 25, and the temperature can be held. Furthermore, in a case where the temperature of the focus ring 21 is increased by the plasma, the temperature rising of the focus ring section 3 is suppressed by adjusting the output of the heater 25, and thus, the temperature of the focus ring section 3 can be constantly maintained.

An interval between the cooling base section 4 and the ceramic ring 23 is a sum of thickness the insulating adhesive layer 24, the heater 25 and the insulating adhesive layer 28, that is, 100 μm to 500 μm.

In this manner, by interposing the insulating adhesive layer 24, the heater 25 and the insulating adhesive layer 28 in a layer shape, the interval between the cooling base section 4 and the ceramic ring 23 can be extremely narrowed, and thus, the temperature of the focus ring 21 can be accurately controlled to a predetermined temperature via the ceramic ring 23.

The coefficient of heat transfer between the cooling base section 4 and the heater 25 is preferably 400 W/m²K or more and 10,000 W/m²K or less, and more preferably, 1,000 W/m²K or more and 4,000 W/m²K or less.

By setting the coefficient of heat transfer between the cooling base section 4 and the heater 25 to the range mentioned above, it is possible to substantially match the temperature rising rate and the cooling rate of the ceramic ring 23 with the temperature rising rate and the cooling rate of the electrostatic chuck section 2 when causing a predetermined current to flow in the heater 25. Thus, it is possible to substantially match the temperature rising rate and the cooling rate of the focus ring 21 with the temperature rising rate and the cooling rate of the electrostatic chuck section 2.

From the above, the temperature of the focus ring 21 can be adjusted by using the heater 26, and the temperature of the focus ring 21 being processing can be constantly maintained. Thus, the temperature of the outer periphery portion of the plate-like specimen W such as the silicon wafer can be stabilized, and thus, the etching characteristics in the plane of the plate-like specimen W can be equalized.

Furthermore, since the surface temperature of the focus ring 21 can be accurately adjusted, it is possible to alleviate the temperature difference between the surface temperature of the focus ring 21 and the surface temperature of the plate-like specimen W placed on the electrostatic chuck section 2, and thus, it is possible to prevent the deposits from being deposited on the focus ring 21.

As described above, according to the electrostatic chuck apparatus of the present embodiment, since the heater 25 is provided between the ceramic ring 23 and the cooling base section 4, it is possible to alleviate the stress to the ceramic ring 23 when the heater 25 generates heat. Furthermore, since a configuration is used in which the heater 25 is not embedded in ceramics, the manufacturing step can be simplified, and the manufacturing cost can also be reduced.

Since the heater 25 is the non-magnetic body, even in a case where the high frequency is applied to the heater 25, there is no fear of generation of heat due to the high frequency. Thus, even when the high frequency is applied, the self generation of heat can be avoided.

Since the heater 25 is fixed to the ceramic ring 23 and the cooling base section 4 via the insulating adhesive layers 24 and 28, by interposing the insulating adhesive layers 24 and 28 between the ceramic ring 23 and the cooling base section 4, the thermal stress due to the thermal expansion of the heater 25 can be alleviated, and the thermal stress due to the thermal expansion of the ceramic ring 23 and the cooling base section 4 can also be alleviated.

In addition, since the optical thermometer 35 for directly measuring the temperature of the ceramic ring 23 is fixed to the through hole 34 of the cooling base section 4, it is possible to prevent the heat of the ceramic ring 23 escaping to the cooling base section 4 via the optical thermometer 35.

Furthermore, since the temperature of the ceramic ring 23 is directly measured by the optical thermometer 35, there is no fear of an influence of the generation of heat from the heater 25, and the temperature of the ceramic ring 23 itself can be accurately measured.

In addition, in order to increase insulating properties between the cooling base section 4 and the heater 25, an insulating ceramic membrane or an insulating organic film may be provided between the cooling base section 4 and the heater 25.

Furthermore, the thermal conducting sheet 22 is provided between the focus ring 21 and the ceramic ring 23, but a configuration may be adopted in which helium gas or the like flows, instead of the thermal conducting sheet 22.

Furthermore, as a target that directly measures the temperature using the optical thermometer 35, the temperature of the focus ring 21 or the thermal conducting sheet 22 may be directly measured, without being limited to the ceramic ring 23.

Figure 5:
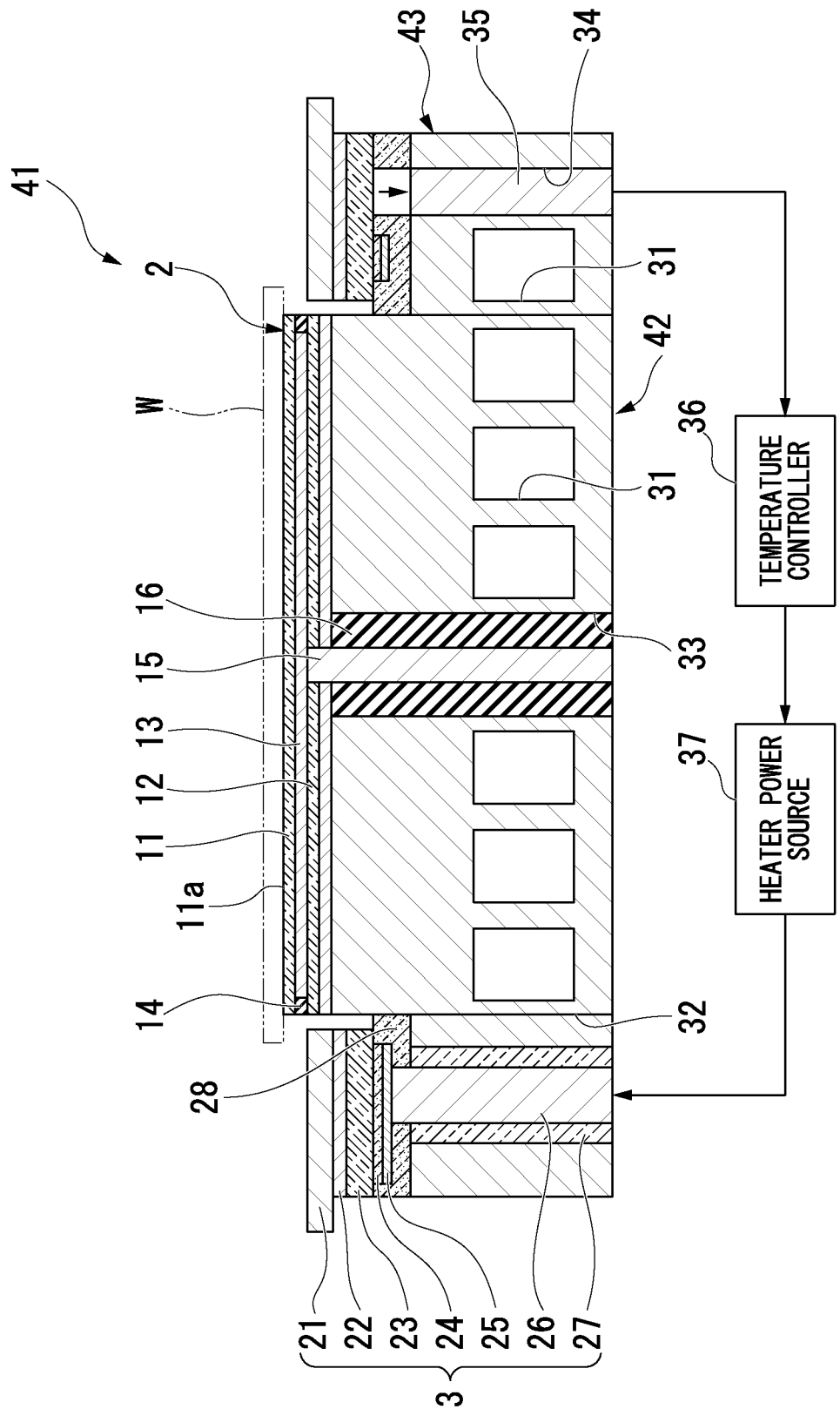
FIG. 5 is a cross-sectional view that shows a modified example of the electrostatic chuck apparatus of an embodiment of the present invention.

FIG. 5 is a cross-sectional view that shows a modified example of the electrostatic chuck apparatus of the present embodiment. The electrostatic chuck apparatus 41 is different from the electrostatic chuck apparatus 1 in that the cooling base section is divided into a disk-shaped thick cooling base section 42 for cooling the electrostatic chuck section 2 and an annular thick cooling base section 43 provided so as to surround the cooling base section 42 for cooling the focus ring section 3. In other respects, the electrostatic chuck apparatus 41 is exactly the same as the electrostatic chuck apparatus 1 mentioned above.

According to the electrostatic chuck apparatus 41, since the thick cooling base section 42 for cooling the electrostatic chuck section 2 and the cooling base section 43 for cooling the focus ring section 3 are provided, the electrostatic chuck section 2 can be cooled by the cooling base section 42, and the focus ring section 3 can be cooled by the cooling base section 43, respectively and independently, whereby it is possible to enhance the temperature controllability of each of the electrostatic chuck section 2 and the focus ring section 3.

REFERENCE SIGNS LIST

1: electrostatic chuck apparatus
2: electrostatic chuck section
3: focus ring section
4: cooling base section
11: dielectric layer
11a: upper surface
12: insulating layer
13: electrostatic adsorption internal electrode
14: insulating material layer
15: power supplying terminal
16: insulator
21: focus ring
22: thermal conducting sheet
23: ceramic ring (ceramic plate)
24: (first) insulating adhesive layer
25: heater
26: heater electrode
27: heater insulator
28: (second) insulating adhesive layer
31: flow path
32 to 34: through hole
35: optical thermometer (temperature measuring means)
36: temperature controller
37: heater power source
41: electrostatic chuck apparatus
42, 43: cooling base section

The invention claimed is:

1. An electrostatic chuck apparatus comprising:
an electrostatic chuck section, one main surface of which is a placing surface for placing a plate-like specimen, and which is equipped with an internal electrode for electrostatic adsorption;
an annular focus ring section which is provided so as to surround the electrostatic chuck section;
a cooling base section which is provided on the other main surface side of the electrode chuck section to cool the electrostatic chuck section and the focus ring section,
wherein the focus ring section includes an annular focus ring, an annular thermal conducting sheet which is adhered to a lower surface of the focus ring, an annular ceramic plate which is adhered to a lower surface of the thermal conducting sheet, a sheet-like heater portion which is provided between the ceramic plate and the cooling base section and is formed from a non-magnetic body, and an electrode section which supplies electricity to a heater section, and
the heater section is fixed to the ceramic plate by a first insulating adhesive layer, is fixed to the cooling base section by a second insulating adhesive layer, and is insulated by the first insulating adhesive layer and the second insulating adhesive layer.

2. The electrostatic chuck apparatus according to claim 1, wherein the ceramic plate is constituted by a plurality of annular ceramic pieces which is formed by dividing the annular ceramic plate in a radial direction.

3. The electrostatic chuck apparatus according to claim 1, wherein an insulating ceramic membrane or an insulating organic film is provided between the cooling base section and the heater section.

4. The electrostatic chuck apparatus according to claim 1, wherein temperature measuring means is provided in the focus ring section.

5. The electrostatic chuck apparatus according to claim 1, wherein the heater section has an electrical conductivity of $0.5 \times 10^6$ S/m or more and $20 \times 10^6$ S/m or less, and a coefficient of thermal expansion of $0.1 \times 10^{-6}$/K or more and $100 \times 10^{-6}$/K or less.

6. The electrostatic chuck apparatus according to claim 1, wherein the heater section is formed from titanium or titanium alloy.

7. The electrostatic chuck apparatus according to claim 1, wherein the ceramic plate has insulating properties and has thermal conductivity of 1 W/mK or more.

8. The electrostatic chuck apparatus according to claim 1, wherein the coefficient of heat transfer between the heater section and the cooling base section is 400 W/m²K or more and 10,000 W/m²K or less.

9. The electrostatic chuck apparatus according to claim 1, wherein the coefficient of heater transfer of the thermal conducting sheet is equal to or greater than 500 W/m²K.

10. The electrostatic chuck apparatus according to claim 1, wherein the insulating adhesive layer contains a filler.

11. An electrostatic chuck apparatus comprising:
an electrostatic chuck section, one main surface of which is a placing surface for electrostatic adsorption of a plate-like specimen, and which is equipped with an internal electrode for electrostatic adsorption;
an annular focus ring section which is provided so as to surround the electrostatic chuck section; and
a cooling base section which is provided on the other main surface side of the electrode chuck section to cool the electrostatic chuck section and the focus ring section,
wherein the focus ring section includes a focus ring, a ceramic plate which is provided between the focus ring and the cooling base section, a heater section which is provided between the ceramic plate and the cooling base section and is formed from a non-magnetic body, and an electrode section which supplies electricity to the heater section; and
the ceramic plate is constituted by a plurality of annular ceramic pieces which is formed by dividing the annular ceramic plate in a radial direction.

* * * * *